United States Patent [19]

Tran

[11] Patent Number: 4,991,141
[45] Date of Patent: Feb. 5, 1991

[54] SENSE AMPLIFIER AND METHOD FOR SENSING THE OUTPUTS OF STATIC RANDOM ACCESS MEMORY CELLS

[75] Inventor: Hiep V. Tran, Carrollton, Tex.

[73] Assignee: Texas Instruments Incorporated, Dallas, Tex.

[21] Appl. No.: 477,088

[22] Filed: Feb. 8, 1990

[51] Int. Cl.$^5$ .......................................... G11C 13/00
[52] U.S. Cl. .................................. 365/207; 307/530
[58] Field of Search ............ 365/207, 189.01, 189.03, 365/230; 307/530

[56] References Cited

U.S. PATENT DOCUMENTS 4,509,147 4/1985 Tanimura ............................ 365/207

OTHER PUBLICATIONS

Tran, H., et al., "An 8ns Battery Back-Up Submicron BiCMOS 256K ECL SRAM," ISSCC Digest of Technical papers, pp. 188–189, Feb., 1988.
Yang, T., et al., "A 4-ns 4Kx1-bit Two-Port BiCMOS SRAM," IEEE J. Solid-State Circuits, vol. 23, No. 5, pp. 1030–1040, Oct., 1988.

Primary Examiner—Terrell W. Fears
Attorney, Agent, or Firm—James C. Kesterson; James T. Comfort; Melvin Sharp

[57] ABSTRACT

A sense amplifier (10) is provided for with use with a static random access memory. Cascode preamplifier transistors (20a, 20b) convert the complementary currents appearing on bitlines (14a, 14b) coupled to the complementary outputs BIT and $\overline{\text{BIT}}$ of a memory cell (12). The currents are converted into differential voltages and amplified into emitter coupled logic compatible voltages which are output from sense amplifier (10) on DATA line (30a) and $\overline{\text{DATA}}$ line (30b). In a preferred embodiment, a first feedback loop is provided from $\overline{\text{DATA}}$ line (30b) to preamplifying transistor (20a) and a second feedback loop is provided from DATA line (30a) to preamplifier transistor (20b).

21 Claims, 2 Drawing Sheets

SENSE AMPLIFIER AND METHOD FOR SENSING THE OUTPUTS OF STATIC RANDOM ACCESS MEMORY CELLS

TECHNICAL FIELD OF THE INVENTION

The present invention relates in general to sense amplifiers and more particularly to an apparatus and method for sensing the outputs of static random access memory cells.

BACKGROUND INVENTION

The static random access memory (SRAM) has numerous applications in computers and other digital equipment. The SRAM is typically composed of address input buffers, wordline decoders, static memory cells, bitline decoders, and sense amplifiers and output buffers. Although SRAMs can be manufactured in either bipolar or MOS technologies, the most popular and widely used RAMs are manufactured using MOS technology.

In an integrated circuit, static random access memory devices are often organized into rows and columns of memory cells. In such devices, the term "wordline" generally refers to a set of conductors of which one, when active, selects the addressed row of memory cells; the term "bitlines" generally refers to a set of conductors which communicate data between memory cells in the address columns and corresponding sense amplifiers.

A SRAM memory cell is provided with a pair of complementary input/output ports, with each port connected to one of two bitlines dedicated to the column containing the cell. When the wordline of the row containing a selected cell is activated, and differential currents are applied between the two bitlines connected to the selected cell, the cell is latched to a specific data state with a logic high or low indicated on one port and its complement on the other, thereby writing data into the cell. To read data on a selected cell, the wordline of the row containing the selected cell is activated, and the complementary outputs on the pair of bitlines associated with the selected cell are differentially sensed using a sense amplifier which detects the currents corresponding to the complementary data states on the bitlines. The sense amplifier then outputs complementary amplified signals for communication to output stages of the circuit.

Deep submicron BICMOS circuit techniques are used in the design of high performance, hot carrier immune SRAMs. The goal of these techniques is to achieve SRAMs with ultra high density, high speed and low power dissipation. The sensing circuits of high performance SRAMs is an area where the need for improved designs is critical. The SRAMs under development require a sensing approach which is fast, dissipates less power and has good gain. Conventional sense amplifiers, typically using a pair of cascode transistors for differential amplification, have been limited to maximum gains insufficient for proper operation of high performance SRAMs. It has been previously proposed to use emitter coupled logic (ECL) bipolar circuit techniques in the peripheral circuitry of BICMOS SRAM memory arrays to increase speed; however, the speed was at the expense of power dissipation.

Thus, a need has arisen for a sensing amplifier which can operate in conjunction with a high performance, ultra high density, SRAM. Such a sensing technique must have high speed, low power dissipation, and improved gain over conventional sense amplifiers. Further, the sense amplifier must help prevent read disturb problems which occur with conventional sense amplifiers when the bitline connected to a memory cell's low output is pulled too low.

SUMMARY OF THE INVENTION

The present invention uses emitter coupled logic (ECL) circuits to provide a high performance sense amplifier for use with BICMOS SRAMs. The invention may be incorporated into a BICMOS SRAM read/write memory having a pair of complementary bit lines associated with each column of memory cells.

In accordance with one aspect of the present invention, a sense amplifier is provided for use with a random access memory cell. A first preamplifier converts the current from the first of the complementary outputs into a first differential voltage. A second preamplifier converts the current from the second of the complementary outputs into a second differential voltage. The first and second differential voltages are amplified using a differential amplifier and then output as a first and second complementary outputs.

This technique of preamplification followed by differential amplification results in an improvement in gain over prior art sense amplifiers. Further, the use of emitter-coupled logic circuitry provides improved speed which is a significant advantage over prior art sense amplifiers. Finally, gates are provided which turn off the sense amplifier elements, thus reducing overall power dissipation in the SRAM.

In a preferred embodiment, feedback circuits are provided between the complementary outputs of the sense amplifier, and the preamplifier transistors to provide improved speed and stability. The feedback additionally helps latch the sense amplifier to the correct state indicated by the memory cell.

BRIEF DESCRIPTION OF THE DRAWINGS

Other aspects of the invention and its advantages will be discerned when one refers to the following detailed description as taken in conjunction with the drawings, in which.

DETAILED DESCRIPTION OF THE INVENTION

Figure 1:
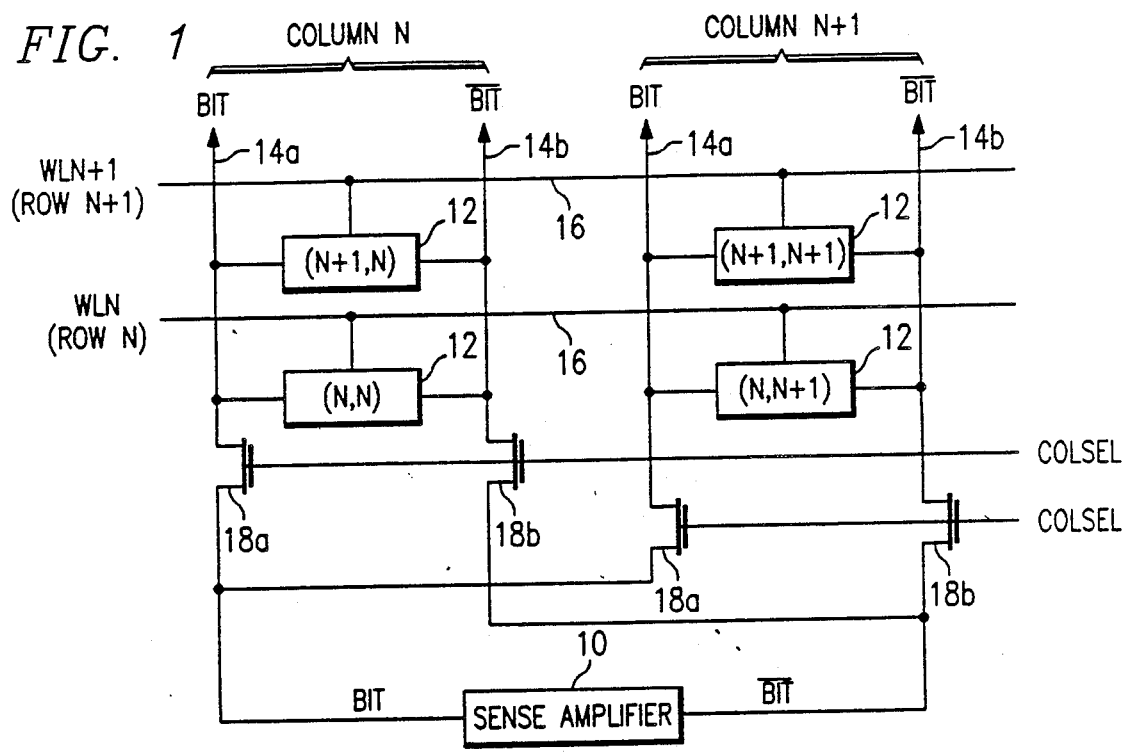
FIG. 1 is a functional block diagram of a portion of a static random access memory using a sense amplifier according to the invention.

Referring to FIG. 1, a sense amplifier 10 according to the invention is shown as part of a static random access memory (SRAM) formed by an array of memory cells 12 in columns and in rows. For the sake of clarity, only two rows, two columns, and two memory cells in each column have been shown, although it will be understood that very large memory arrays will often be utilized Each column is formed from two bitlines 14a and 14b connected to the respective complementary outputs, BIT and $\overline{\text{BIT}}$, of each of the cells 12 in the column. Each row of cells is connected to a respective wordline 16. Thus, a selected cell, for example cell (n,n), may be addressed through connections to a pair of bitlines 14 and a wordline 16.

Each bitline 14 is connected to the drain of a respective field effect transistor 78. The sources of transistors 18 are connected to the respective BIT or $\overline{\text{BIT}}$ inputs of sense amplifier 10. The gates of transistors 18 are connected to a signal source providing column select signal COLSEL.

To read a selected cell in the array, the bitlines 14 of the column containing the selected cell are gated by gate transistors 18a–b to sense amplifier 10 by a column select signal ($\overline{\text{COLSEL}}$). A voltage is applied to the word line 16 of the row containing the selected cell 12, such that the selected cell 12 is activated, causing the selected cell 12 to output currents, corresponding to complementary data state signals at outputs BIT and $\overline{\text{BIT}}$, onto bit lines 14a and 14b. The currents are gated through gating transistors to sense amplifier 10.

Figure 2:
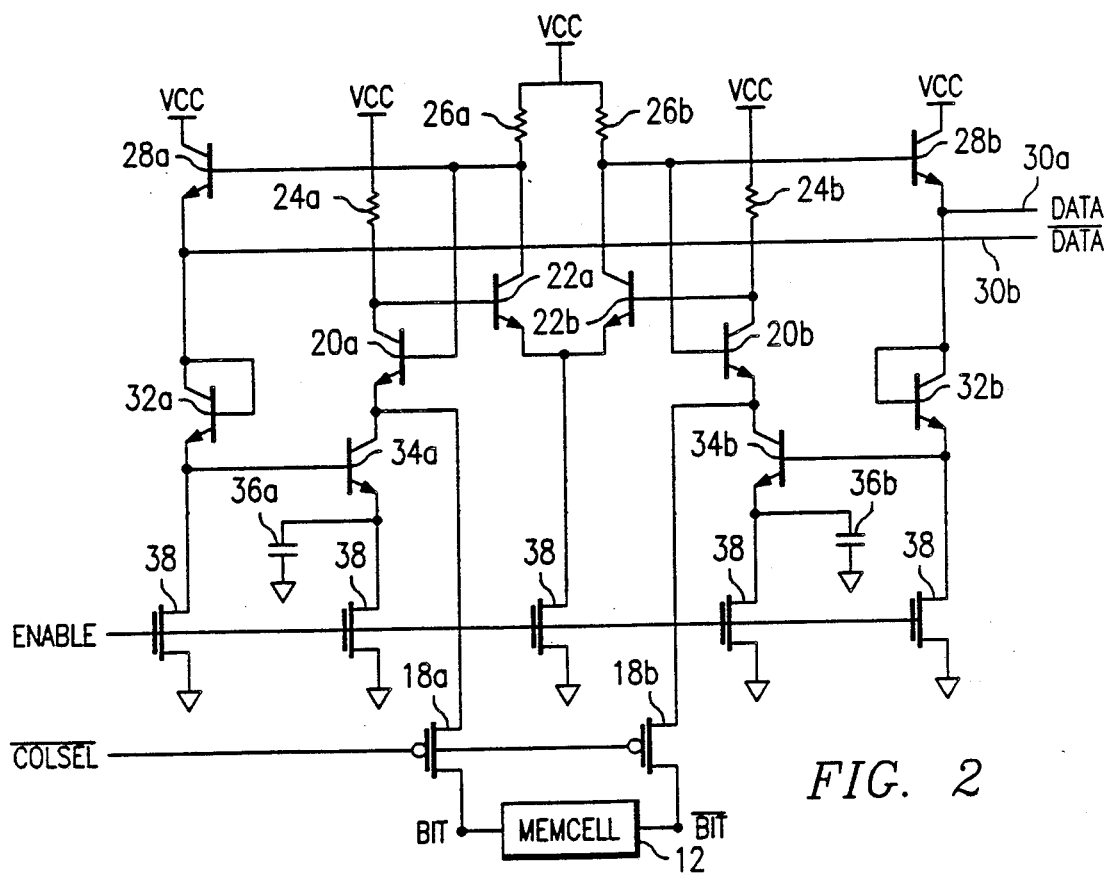
FIG. 2 is an electrical schematic diagram of a sense amplifier according to the invention.

Referring next to FIG. 2, a schematic diagram of sense amplifier 10 is shown connected to a selected memory cell 12 in the array. A pair of preamplifier transistors 20 are provided. The emitter of transistor 20a is connected to the BIT output of memory cell 12 while the emitter of transistor 20b is connected to output $\overline{\text{BIT}}$. The collector of transistor 20a is coupled through pull down resistor 24a to Vcc under the collector of transistor 20b coupled to Vcc through resistor 24b.

A pair of amplifier transistors 22a and 22b are cross-coupled with preamplifier transistors 20a and 20b respectively. The base of preamplifier transistor 20a is tied to the collector of amplifier transistor 22a and the base of amplifier transistor 20a. The node formed by the connection between the collector of amplifier transistor 22a and the base of preamplifier 20a is tied to Vcc through pull down resistor 26b. An identical technique is used in connecting preamplifier transistor 20b, amplifier transistor 22b and resistor 26b.

Two output drive transistors are provided for transmission of the sense amplifier 10 complementary outputs DATA and $\overline{\text{DATA}}$ to other peripheral circuits of the memory array. The base of output transistor 28a is coupled to the collector of amplifier transistor 22a. The emitter of output transistor 28a is coupled to $\overline{\text{DATA}}$ line 30b. The base of output transistor 28b is coupled to the collector of amplifier transistor 22b with the emitter of output transistor 28b coupled to DATA line 30b.

The emitters of output transistor 28 also are connected respectively to a pair of feedback loops. The emitter of output transistor 28a is tied to the collector and the base of drive transistor 32a. The emitter of drive transistor 32a is coupled to the base of feedback transistor 34a. The collector of feedback transistor connects to the emitter of preamplifier transistor 20a to complete the feedback loop. A capacitor 36a is connected to the emitter of feedback transistor 34a to provide loading. An identical feedback loop is disposed between the emitter of output transistor 28b and the emitter of preamplifier transistor 20b.

Each of the emitters of transistors 22, 32 and 34 has a connection to the drain of a corresponding field effect transistor 38. The sources of transistors 38 are tied to ground while the gates of transistors 38 are connected to a signal source providing an enable signal ENABLE.

Currents corresponding to data state signals at outputs BIT and $\overline{\text{BIT}}$ are provided at the emitters of respective cascode preamplifier transistors 20a and 20b. The currents at the emitters of transistors 20a and 20b are converted into a pair of differential voltages which are applied to the bases of differential amplifier transistors 22a and 22b.

Preamplifier transistor 20a and amplifier transistor 22a operate in an identical but complementary fashion with preamplifier transistor 20b and amplifier transistor 22b. The operation of the amplifier function of sense amplifier 10 can be illustrated in terms of transistor 20a and 22a. Transistors 20a and 22b are biased to be on and out of saturation while the sense amplifier is activated by current sources (discussed below). The current corresponding to the data state signal at memory cell 12 output BIT is applied to the emitter of preamplifier transistor 20a, which results in a corresponding change in current through the collector of transistor 20a. The current change through the collector of transistor 20a results in a small voltage swing across resistor 24a which appears at the base of amplifier transistor 22a.

The emitter of transistor 22a is connected to the emitter of transistor 22b to form a differential amplifier. The collectors of transistors 22a and 22b are coupled to voltage VCC through pulled down resistors 26a and 26b, such that the small voltage swings appearing at the bases of transistors 22a and 22b are amplified to ECL voltages appearing at the collectors of transistors 22a and 22b. The ECL voltages appearing at the collectors of 22a and 22b are further buffered respectively by transistors 28a and 28b before transmission as sense amplifier outputs on DATA line 30a and $\overline{\text{DATA}}$ line 30b to other circuitry on the periphery of the memory array.

Unlike the standard cascode sensing circuit technique, the bases of preamplifier transistors 20a and 20b are connected to the outputs (the collectors) of differential amplifier transistors 22a and 22b. This connection provides a first feedback path for speeding up the sensing process. In addition, the present circuit tends to prevent read disturb problem which occurs with conventional sense amplifiers when the bitline voltage on low side output of memory cell 12 is pulled too low. In the present invention, the sense amplifier 10 will pull up the voltage on the bitline 14 on the side with greater ground current and will lower the voltage on the circuit side with lesser ground current.

Two positive dynamic current feedback loops are provided to help latch the sense amplifier to the correct state and improve the operational stability and performance. The first feedback loop, comprising transistors 32a and 34a and capacitor 36a, feeds a portion of the current on $\overline{\text{DATA}}$ line 30b back to the emitter of preamplifier transistor 20a. The second feedback loop feeds a portion of the current appearing on DATA line 30a back to the emitter of preamplifier transistor 20b. As with preamplifier transistors 20 and amplifier transistors 22, these feedback loops operate identically but in a complementary fashion.

Using the feedback loop comprising transistors 32a, 34a and capacitor 36a as an example, the operation of both feedback loops can be demonstrated. Drive transistor 36a amplifies a portion of the current appearing on the $\overline{\text{DATA}}$ line 30b and applies it to the base of feedback transistor 34a. The change in base current applied to feedback transistor 34a results in a change in collector current flowing into transistor 34a and change current flow through the emitter of preamplifier transistor 20a. The change in current helps latch preamplifier transistor 20a to the data state appearing on memory cell 12 output BIT. Capacitor 36a provides a capacitive load for stabilizing the response of the feedback loop.

MOS transistors 38 provide current sources for the bipolar transistors comprising sense amplifier 10. Since all the transistors remain on and in the linear region while operation of sense amplifier 10 is required, MOS transistors 38 are gated with an enable signal such that sense amplifier 10 can be shut down when its operation is not required, thereby reducing the power consumption in the integrated circuit.

Figure 3:
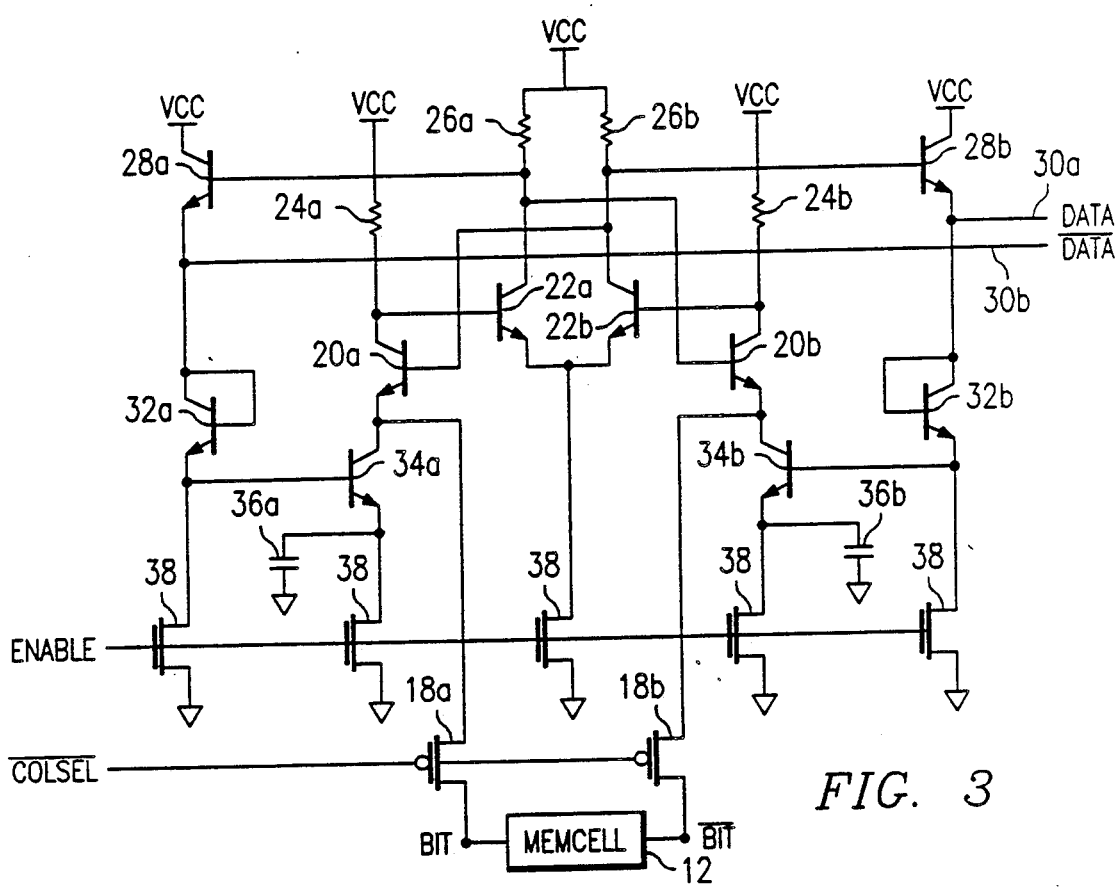
FIG. 3 is an electrical schematic diagram of a sense amplifier according to a first alternative embodiment of the invention.

FIG. 3 depicts an alternate embodiment for providing a first feedback path for speeding up the sensing process, like characters identifying like parts. The base of transistor 20a is now connected to the collector of transistor 22b and the base of transistor 20b is now connected to the collector of transistor 22a. In this configuration, the overall sensing process remains the same, only the feedback is provided from the complement of the outputs of the circuit depicted in FIG. 2.

Figure 4:
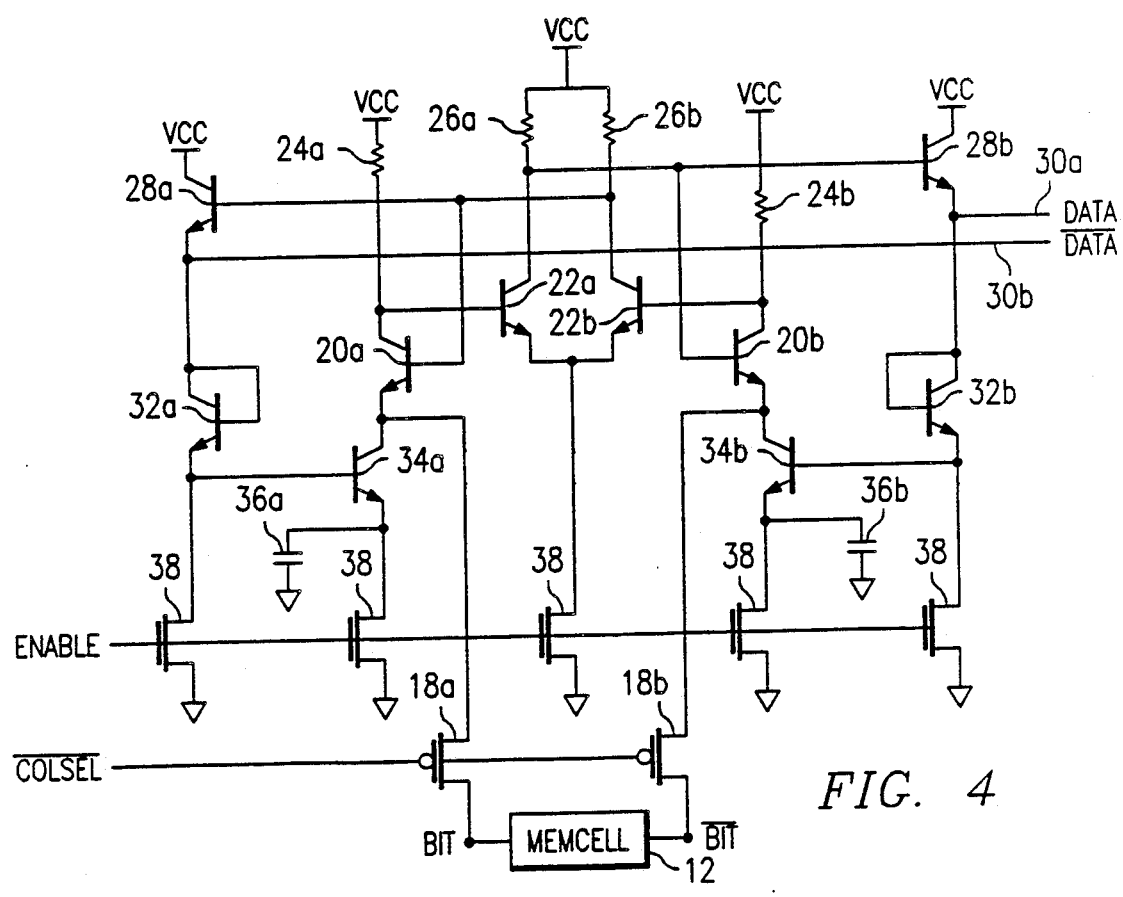
FIG. 4 is an electrical schematic diagram of a sense amplifier according to a second alternative embodiment of the invention.

Similarly, FIG. 4 depicts an alternate embodiment in which the dynamic feedback loops provide feedback from the complement of the outputs of the circuit depicted in FIG. 2, like characters identifying like parts. The base of transistor 20a and the base of transistor 28a are connected to the collector of transistor 22b. The bases of transistors 20b and 28b are connected to the collector of 22a. Again, the overall operation of the sense amplifier remains the same, only the sources of the feedback have been reversed.

While a preferred embodiment of the invention and its advantages had been set forth in the above detailed description, the invention is not limited thereto but only by the scope and spirit of the appended claims.

What is claimed is:

1. A sense amplifier for use with a random access memory cell having complementary outputs, comprising:
   a first preamplifier for converting a first current from a first complementary output of said memory cell into a first differential voltage signal;
   a second preamplifier for converting a second current from a second complementary output of said memory cell into a second differential voltage signal;
   a differential amplifier for amplifying said first and second differential voltage signals; and
   first and second sense amplifier complementary outputs for outputting first and second amplified differential voltage signals.

2. The sense amplifier of claim 1, and further comprising:
   a first feedback circuit providing a feedback path between said first complementary output and said first preamplifier; and
   a second feedback circuit providing a feedback path between said second complementary output and said second preamplifier.

3. The sense amplifier of claim 1, and further comprising:
   a first feedback circuit providing a feedback path between said first complementary output and said second preamplifier; and
   a second feedback circuit providing a feedback path between said second complementary output and said first preamplifier.

4. The sense amplifier of claim 1, wherein said first and second preamplifiers comprise first and second cascode transistors.

5. The sense amplifier of claim 1, wherein said differential amplifier comprises first and second emitter coupled amplifying transistors.

6. A sense amplifier for use with a column of memory cells, each cell in the column having a pair of complementary outputs connected to respective bit lines of a pair of bitlines forming each column, comprising:
   a first preamplifier transistor coupled to a first bitline of a column of memory cells;
   a second preamplifier transistor coupled to a second bitline of a column of memory cells;
   first and second emitter coupled amplifier transistors forming a differential amplifier, said first amplifier transistor coupled to said first preamplifier transistor, and said second amplifier transistor coupled to said second preamplifier transistor;
   said amplifier transistors including first and second sense amplifier outputs;
   a first feedback circuit providing a first feedback path from a said sense amplifier output to said first preamplifier transistor; and
   a second feedback circuit providing a second feedback path from another said sense amplifier output to said second preamplifier transistor.

7. The sense amplifier of claim 6, wherein the emitter of said first preamplifier transistor is coupled to said first bitline and the emitter of said second preamplifier is coupled to said second bitline.

8. The sense amplifier of claim 7, wherein:
   the collector of said first preamplifier transistor is coupled to the base of said first amplifier transistor; and
   the collector of said second preamplifier transistor is coupled to the collector of said second amplifier transistor.

9. The sense amplifier of claim 8, wherein:
   the base of said first amplifier transistor is coupled to the collector of said first amplifier transistor; and
   the base of said second amplifier transistor is coupled to the collector of said second amplifier transistor.

10. The sense amplifier of claim 8, wherein:
    the base of said first preamplifier transistor is coupled to the collector of said second amplifier transistor; and
    the base of said second preamplifier transistor is coupled to the collector of said first amplifier transistor.

11. The sense amplifier of claim 8, wherein said first feedback circuit is coupled to the emitter of said first preamplifier transistor and said second feedback circuit is coupled to the emitter of said second preamplifier transistor.

12. The sense amplifier of claim 11, wherein: said first feedback circuit comprises:
    a drive amplifier transistor coupled to said first sense amplifier output;
    a feedback transistor coupled to said drive amplifier transistor for selectively pulling down the emitter of said first preamplifier transistor; and
    said second feedback circuit comprises:
    a drive amplifier transistor coupled to said second sense amplifier output; and
    a feedback transistor coupled to said drive amplifier for selectively pulling down the emitter of said second preamplifier transistor.

13. The sense amplifier of claim 11, wherein: said first feedback circuit comprises:

a drive amplifier transistor coupled to said first sense amplifier output;

a feedback transistor coupled to said drive amplifier transistor for selectively pulling down the emitter of said second preamplifier transistor; and said second feedback circuit comprises:

a drive amplifier transistor coupled to said second sense amplifier output; and a feedback transistor coupled to said drive amplifier for selectively pulling down the emitter of said first preamplifier transistor.

14. The sense amplifier of claim 7, wherein said first preamplifier is switchably coupled to said first bitline and said second preamplifier is switchably coupled to said second bitline.

15. A sense amplifier for use with a memory cell having first and second complementary outputs, comprising;

a first cascode preamplifying transistor, the emitter of said first preamplifying transistor connected to a first memory cell complementary output;

a second cascode preamplifying transistor, the emitter of said second preamplifying transistor connected to a second memory cell complementary output;

a differential amplifier comprising first and second emitter coupled amplifying transistors, said first amplifying transistor coupled to said first preamplifying transistor, said second amplifying transistor coupled to said second preamplifying transistor;

first and second sense amplifier complementary outputs;

a first feedback circuit providing a feedback path between said first sense amplifier complementary output and the emitter of said first preamplifying transistor; and a second feedback circuit providing a feedback path between said second sense amplifier complementary output and the emitter of said second preamplifying transistor.

16. The sense amplifier of claim 15, wherein the base of said first preamplifying transistor is coupled to the collector of said first amplifying transistor, and the base of said second preamplifying transistor is coupled to the collector of said second amplifying transistor.

17. The sense amplifier of claim 15, wherein said feedback circuits each comprise:

a drive transistor for amplifying a signal on a respective sense amplifier output;

a feedback transistor connected to said drive transistor for selectively pulling down the emitter of a respective said preamplifier transistor; and a capacitor coupled between ground and the emitter of a respective said preamplifying transistor.

18. A method for sensing the complementary output of a random access memory cell, comprising the steps of:

converting a first complementary output current of the memory cell into a first voltage signal;

converting a second complementary output current of the memory cell into a second voltage signal; and differentially amplifying said first and second voltage signals to provide first and second output signals.

19. The method of claim 18, and further comprising the steps of:

providing a first feedback from said first output signal in order to latch said first input signal to the desired state; and providing a second feedback from said second output signal in order to latch said second input signal to the desired state.

20. A method for sensing the complementary output of a selected memory cell in an array of memory cells formed in columns and in rows, each column having a first and second bitlines and each row having a wordline, comprising the steps of:

selecting the row containing the selected cell by applying a voltage to the wordline forming the row;

selecting the column containing the selected memory cell by gating the first and second bitlines to a sense amplifier;

converting the current on the first bitline into a first voltage signal;

converting the current on the second bitline into a second voltage signal; and differentially amplifying the first and second voltage signals.

21. The method of claim 20, and further comprising the steps of:

feeding back a portion of the amplified first voltage signal in order to latch said first voltage signal; and feeding back a portion of the amplified second voltage signal in order to latch said second voltage signal.

* * * * *